(12) United States Patent
Ohshima

(10) Patent No.: US 7,248,452 B2
(45) Date of Patent: Jul. 24, 2007

(54) METHOD OF PROTECTING SEMICONDUCTOR DEVICE AND PROTECTION APPARATUS FOR SEMICONDUCTOR DEVICE USING THE SAME

(75) Inventor: Shunzou Ohshima, Toyota (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/519,745

(22) PCT Filed: Jul. 10, 2003

(86) PCT No.: PCT/JP03/08786

§ 371 (c)(1),
(2), (4) Date: Dec. 29, 2004

(87) PCT Pub. No.: WO2004/008500

PCT Pub. Date: Jan. 22, 2004

(65) Prior Publication Data

US 2005/0275990 A1   Dec. 15, 2005

(30) Foreign Application Priority Data

Jul. 12, 2002   (JP)   ............... 2002-204729

(51) Int. Cl.
*H02H 3/08* (2006.01)
*H02H 9/02* (2006.01)
*H02H 3/20* (2006.01)
*H02H 9/04* (2006.01)
*H02H 3/00* (2006.01)

(52) U.S. Cl. ............... 361/93.1; 361/91.1; 361/88

(58) Field of Classification Search ............... 361/93.1, 361/91.1, 88
See application file for complete search history.

(56) References Cited

U.S. PATENT DOCUMENTS

| 6,166,530 | A | 12/2000 | D'Angelo |
| 6,335,577 | B1 | 1/2002 | Baba |
| 6,377,032 | B1 * | 4/2002 | Andruzzi et al. ........... 323/224 |
| 6,400,545 | B1 | 6/2002 | Baba |
| 6,474,762 | B2 * | 11/2002 | Taki et al. .................... 347/10 |
| 6,552,889 | B1 | 4/2003 | Huang et al. |

(Continued)

FOREIGN PATENT DOCUMENTS

EP   0 890 844 A2   1/1999

(Continued)

*Primary Examiner*—Stephen W. Jackson
*Assistant Examiner*—Dharti H. Patel
(74) *Attorney, Agent, or Firm*—Sughrue Mion, PLLC

(57) ABSTRACT

A protection apparatus for a semiconductor device includes a DC power source, a load, a semiconductor device arranged between the DC power source and the load and switches the load between a driving state and a stopping state, a comparator comparing a voltage drop across the semiconductor device with a predetermined reference voltage, and a cut off unit cutting a conduction of the semiconductor device between the DC power source and the load when the voltage drop is greater than the predetermined reference voltage. A constant of the circuit element is set so that the reference voltage is not greater than a critical voltage. The critical voltage is a product of the on-resistance of the semiconductor device when its channel temperature is at an upper limit of the permissible temperature, and a minimum current value which causes the channel temperature to reach the upper limit of the permissible temperature by the self-heating due to Joule heat.

4 Claims, 3 Drawing Sheets

U.S. PATENT DOCUMENTS 6,624,994 B1 * 9/2003 Schmoock et al. ........ 361/93.1

FOREIGN PATENT DOCUMENTS

| | | |
|---|---|---|
| JP | 64-016258 A | 1/1989 |
| JP | 02-087817 A | 3/1990 |
| JP | 06-180332 A | 6/1994 |
| JP | 7-113826 | 5/1995 |
| JP | 8-70244 A | 3/1996 |
| JP | 8-307221 | 11/1996 |
| JP | 9-145749 | 6/1997 |
| JP | 9-167955 A | 6/1997 |
| JP | 10-335998 | 12/1998 |
| JP | 2000-231417 | 8/2000 |
| JP | 2000-235424 | 8/2000 |
| JP | 2000-350440 A | 12/2000 |
| JP | 2001-2779373 A | 10/2001 |
| JP | 2002-017036 A | 1/2002 |
| WO | WO 00/79682 A1 | 12/2000 |

* cited by examiner

METHOD OF PROTECTING SEMICONDUCTOR DEVICE AND PROTECTION APPARATUS FOR SEMICONDUCTOR DEVICE USING THE SAME

TECHNICAL FIELD

This application is the national stage application of international application number PCT/JP03/08786, filed on Jul. 10, 2003, incorporated herein by reference.

This invention relates to a protection apparatus for protecting a semiconductor device for use in switching which is arranged between a load and a power source circuit, and a method of setting a circuit constant of the protection apparatus.

BACKGROUND ART

For example, various loads mounted on a vehicle such as a head light, tail lamp, etc. are operated by application of the DC voltage supplied from a battery. As the case may be, an excess current flows through each load because of malfunction of a circuit, operation failure, etc. When the excess current flows, a semiconductor switch and a harness for connecting a power source circuit with the load are excessively heated so that This may lead to a trouble that the harness is burnt.

In order to avoid the occurrence of such a trouble, an excess current protection apparatus has been put into practice which detects the current flowing through the load or semiconductor switch and cuts off the semiconductor switch when the current has become an excess current.

However, the related current protection apparatus only detects the excess current and does not consider-the-temperature of the semiconductor switch. Specifically, when the temperature of the semiconductor switch is high and the ambient temperature is also high, even if the current is not so large, the semiconductor switch may be damaged. On the contrary, when the temperature of the semiconductor switch is low, even if the current is large, the circuit may be cut off although there is no fear of damage.

DISCLOSURE OF THE INVENTION

It is therefore an object of the present invention to provide a protection apparatus for a semiconductor device and a method of setting a circuit constant capable of protecting a semiconductor device considering not only the current flowing through the semiconductor device but also the temperature of the semiconductor device and ambient temperature.

In order to achieve the above object, according to the present invention, there is provided a method of protecting a semiconductor device, comprising the steps of:

providing a DC power source, a load, and a semiconductor device arranged between the DC power source and the load;

providing a circuit element connected to the semiconductor device;

switching the semiconductor device so that the load is changed between a driving state and a stopping state;

cutting off a conduction of the semiconductor device between the DC power source and the load when a voltage drop across the semiconductor device exceeds a predetermined reference voltage; and setting a constant of the circuit element so that the reference voltage is not greater than a critical voltage, wherein the critical voltage is a product of an on-resistance of the semiconductor device when its channel temperature is at an upper limit of the permissible temperature, and a minimum current value which causes the channel temperature to reach the upper limit of the permissible temperature by the self-heating due to Joule heat.

Preferably, when there are changes in the on-resistance for the specification of the semiconductor device, the minimum value among the changes of the on-resistance is employed.

According to the present invention, there is also provided a protection apparatus for a semiconductor device comprising:

a DC power source;

a load;

a semiconductor device, arranged between the DC power source and the load, and switches the load between a driving state and a stopping state;

a circuit element, connected to the semiconductor device;

a comparator, comparing a voltage drop across the semiconductor device with a predetermined reference voltage; and a cut off section, cutting a conduction of the semiconductor device between the DC power source and the load when the voltage drop is greater than the predetermined reference voltage, wherein a constant of the circuit element is set so that the reference voltage is not greater than a critical voltage; and wherein the critical voltage is a product of the on-resistance of the semiconductor device when its channel temperature is at an upper limit of the permissible temperature, and a minimum current value which causes the channel temperature to reach the upper limit of the permissible temperature by the self-heating due to Joule heat.

Preferably, when there are changes in the on-resistance for the specification of the semiconductor device, the minimum value among the changes of the on-resistance is employed.

In the above configurations and methods, since the protection apparatus operates so that the semiconductor device is cut off before its channel temperature reaches the upper limit of the permissible temperature (e.g. 150° C.), the semiconductor device can be surely protected. Further, since the wiring for connecting the semiconductor device is more thermally tough than the semiconductor device, the wiring can be also protected by thermally protecting the semiconductor device.

Further, this invention adopts a system of detecting not only the channel temperature of the semiconductor device but the on-resistance of the semiconductor device. For this reason, as compared with the related current detecting system, this invention can avoid the problem of falling into thermal runaway. Further, even if the current value increases, as long as the channel temperature does not reach the permissible temperature, the on state of the semiconductor device can be maintained, thereby permitting the performance of the semiconductor device to be demonstrated to the maximum.

BEST MODE FOR CARRYING OUT THE INVENTION

Figure 1:
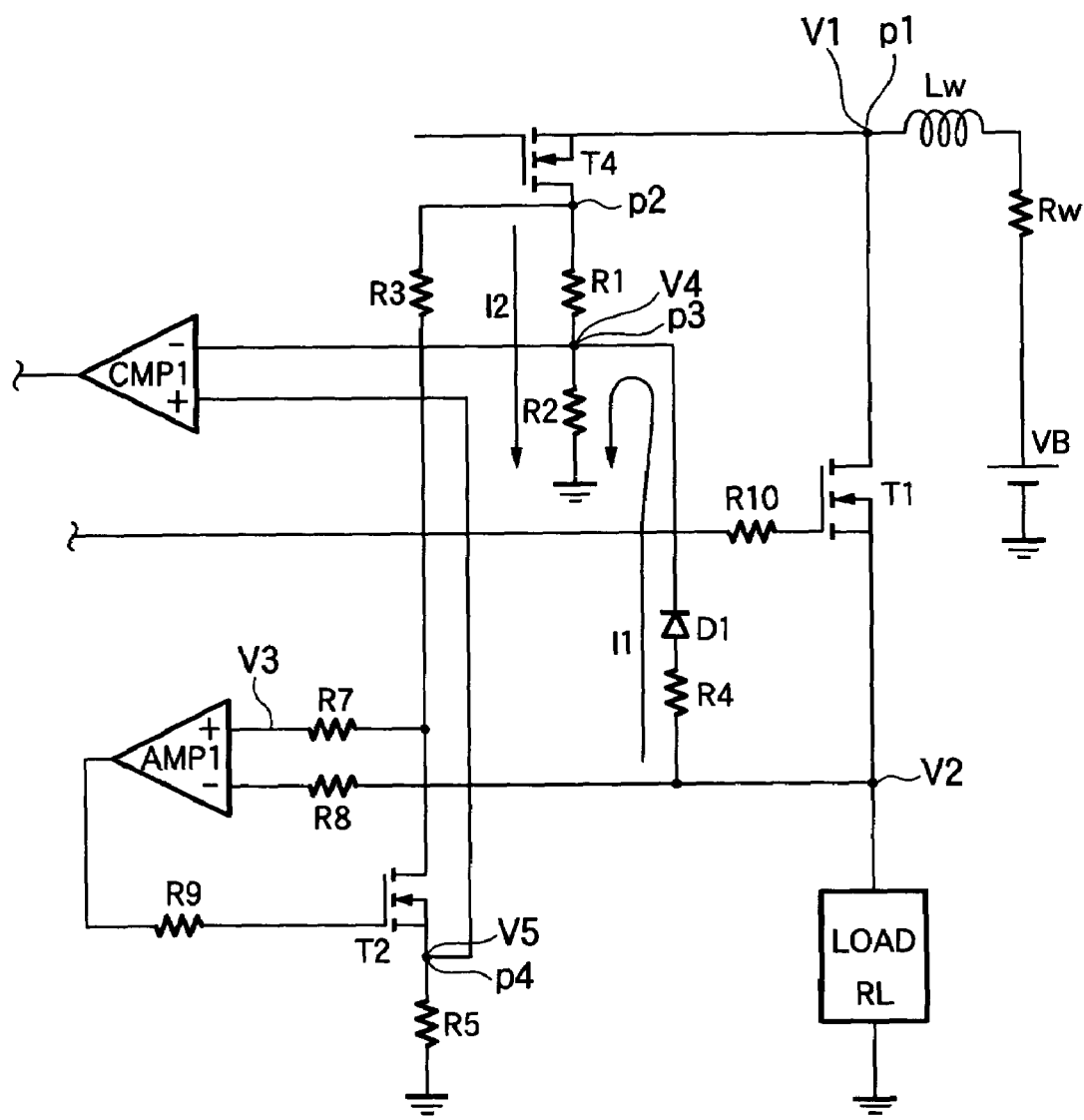
FIG. 1 is a circuit diagram showing the arrangement of the main part of the protection apparatus for a semiconductor device according to the present invention.

Now referring to the drawings, an explanation will be given of an embodiment of the present invention. FIG. 1 is a view for explaining the principle of the protection apparatus for a semiconductor device according to this invention. First, referring to FIG. 1, an explanation will be given of the principle of this embodiment.

As shown in FIG. 1, this circuit includes a DC power source VB, a load RL such as a lamp which is mounted on e.g. a vehicle, and an FET (T1; semiconductor device) arranged between the DC power source and load RL. There are resistances and inductances of wiring between the DC power source VB and the FET (T1), between the FET (T1) and the load RL, and between the load RL and the ground level. These resistances and inductances are designated by Rw and Lw respectively which are located representatively between the DC power source VB and the FET (T1). The connecting point p1 of the wiring and FET (T1), i.e. drain (first main electrode) is connected to ground via a transistor T4, resistor R1 and resistor R2.

The connecting point p2 of the transistor T4 and resistor R1 is connected to ground via a resistor R3, a transistor T2 and a resistor R5. The connecting point of the resistor R3 and the transistor T2 is connected to the plus (+) terminal of an amplifier AMP1 via the resistor R7, and the minus (−) terminal of the amplifier AMP1 is connected to the source of FET (T1) via a resistor R8. The output terminal of the amplifier AMP1 is connected to the gate of the transistor T2 through the resistor R9.

Further, the source of FET (T1) is connected to the connecting point p3 of the resistors R1 and R2 via the resistor R4 and the diode D1, and this connecting point p3 is connected to the minus (−) terminal of the comparator CMP1. The plus (+) terminal of the comparator CMP1 is connected to the connecting point p4 of the transistor T2 and the resistor R5.

By setting various circuit constants so that with respect to the on-resistance $Ron_{150°\ C.}$ of FET (T1) at a prescribed threshold temperature N ° C. (typically, N=150), the following equation (1) holds, the temperature of FET (T1) can be controlled so as not to be exceed 150° C.

$$\alpha * \beta * Ron_{150°\ C.} < RL \quad (1)$$

where α represents a dividing ratio, and β represents multiplication factor of a voltage drop between the drain and the source of FET (T1), VDS, as described later.

Equation (1) will be explained in detail. In this embodiment, using the fact that the on-resistance Ron of FET (T1) increases monotonously in accordance with an increase of the channel temperature of FET (T1). The on-resistance $Ron_{150°\ C.}$ when the channel temperature of FET (T1) reaches 150° C. is previously acquired. The constants of the various circuit elements are set so that FET (T1) is cut off before FET reaches this on-resistance.

In the circuit shown in FIG. 1, if the voltage drop (VDS: drain-source voltage) which is a product of the on-resistance Ron of FET (T1) and drain current ID exceeds a predetermined reference voltage, it is decided that there is abnormality (excess current), and FET (T1) is cut off. In this case, the reference voltage is set at a level proportional to the power source voltage VB.

Concretely, the drain-source voltage VDS is multiplied by β to acquire β*VDS, and the power source voltage VB is divided by α to acquire a reference voltage VB/α. The voltage β*VDS is compared with the voltage VB/α. If β*VDS is larger than VB/α(β*VDS>VB/α), FET (T1) is cut off. More specifically, when the drain-source voltage of FET (T1) exceeds the predetermined reference voltage, FET (T1) is cut off to protect this FET (T1) and other circuit elements.

Now, the dividing ratio α is the voltage V4 which occurs at point p3, which is represented by V4=VB/α.

The multiplication factor β can be represented by R5/R3 so that β*VDS represents the voltage V5 which is generated at the point p4. Namely, the amplifier AMP1 and transistor T2 control the current flowing through the resistor R3 so that the drain-source voltage of FET (T1) is equal to the voltage across the resistor R3. A current flowing through the resistor R5 is the same current flowing through the resistor R3. Therefore, the voltage V5 at the point p4 is (R5/R3)*VDS.

Now assuming that the upper limit of the operating ambient temperature of FET (T1) is TAmax, the thermal resistance of FET (T1) from its channel to the ambient temperature is $Rth_{(ch-A)}$, and the drain current which gives the channel temperature of 150° C. owing to the self-heating when the operation ambient temperature is the upper limit TAmax is $ID_{150°\ C.\ \&\ Tamax}$, the following Equations (2) and (3) hold.

$$\{ID_{150°\ C.\ \&\ TAmax}\}^2 * Ron_{150°\ C.} * Rth_{(ch-A)} + TAmax = 150°\ C. \quad (2)$$

$$ID_{150°\ C.\ \&\ TAmax} * Ron_{150°\ C.} \geq VB/\alpha/\beta \quad (3)$$

Equation (2) defines the minimum value of the drain current which provides the channel temperature of FET (T1) of 150° C. TAmax is determined according to the specification and usually 80–95° C.

Equation (3) represents the condition for cutting off FET (T1) when the $ID_{150°\ C.\ \&\ TAmax}$ flows. The left side of Equation (3) is represented as the product (critical voltage) of the on-resistance of the FET (T1) when its channel temperature is the upper limit (150° C.) of a permissible temperature and the minimum current value where the channel temperature reaches the upper limit of the permissible temperature by the self-heating due to Joule heat. If the reference value (VB/α/β) sets to be equal to or smaller than the product (critical voltage), FET (T1) is cut off before the channel temperature exceeds the upper limit (150° C.) of a permissible temperature.

It is appreciated that from Equation (3), this FET (T1) can be employed for all the loads which meets the following Equation (4).

$$ID * Ron_{150°\ C.} < VB/\alpha/\beta \quad (4)$$

Now assuming that the load resistance is RL, Equation (4) is transformed into the following Equation (5).

$$\alpha * \beta * Ron_{150°\ C.} < VB/ID = RL \quad (5)$$

Namely, Equation (1) as described above is obtained.

Now, it is known from Equation (3) that when the voltage V5 at the point p4 has become equal to or larger than the voltage V4 at the point p3, FET (T1) is controlled so as to cut off. Specifically, (β*VDS≧VB/α) is obtained from Equation (3). β*VDS on the left side is the voltage V5 shown in FIG. 1 and VB/α in the right side is the voltage V4.

Therefore, when $V5 \geq V4$, FET (T1) is cut off. In other words, as seen from the circuit shown in FIG. 2 described later, when the output from the comparator CMP1 has become H level, FET (T1) is cut off.

Thus, constants (resistances) of the respective circuit elements may be set to provide $\alpha$ and $\beta$ which permit Equation (1) to hold. Conversely, FET (T1) having the temperature characteristic which permits Equation (1) to hold may be adopted.

An explanation will be given of a concrete circuit for implementing the above principle. Assuming that $VB \approx V1 \approx V2$, and $V4=VB/\alpha=(I1+I2)R2$ in the circuit shown in FIG. 1, Equation (6) and Equation (7) hold.

$$I1*R4+0.7+(I1+I2)R2=V1 \tag{6}$$

where "0.7" represents the voltage drop of the diode D1

$$I2*R1+(I1+I2)R2=V1 \tag{7}$$

It should be noted that the voltage drop of the transistor T4 is regarded as zero.

From Equation (6) and Equation (7), the following Equation (8) and Equation (9) can be obtained.

$$I1(R4+R2)+I2*R2=V1-0.7 \tag{8}$$

$$I1*R2+I2(R1+R2)=V1 \tag{9}$$

Further, from Equation (8) and Equation (9), the following Equation (10) and Equation (11) can be obtained.

$$I1=\{V1*R1-0.7*(R1+R2)\}/(R1R2+R2R4+R4R1) \tag{10}$$

$$I2=\{V1*R4+R2*0.7\}/(R1R2+R2R4+R4R1) \tag{11}$$

From Equation (10) and Equation (11), the following Equation (12) can be obtained.

$$\begin{aligned} V4 &= (I1+I2)R2 \\ &= R2\{V1(R1+R4)-0.7*R1\}/(R1R2+R2R4+R4R1) \end{aligned} \tag{12}$$

Now, assuming that $R1=R2=10$ [K$\Omega$] and $R4=2$[K$\Omega$], the following Equation (13) is obtained.

$$\begin{aligned} V4 &= (6/7)*V1-0.5 \\ &\cong (6/7)*V1 \end{aligned} \tag{13}$$

When the load and the respective wirings connected to the load as shown in FIG. 1 are in a normal state, the following Equation (14) can be obtained.

$$V5=\beta*VDS=\beta*ID*Ron=\beta*V1/RL*Ron \tag{14}$$

As described above, when $V5>V4$, the output from the comparator CMP1 becomes "H" level and FET (T1) will be cut off. When $V5<V4$, FET (T1) will not be cut off.

When the above Equation (1) holds, $Ron<Ron_{150°\ C.}$. Therefore, the following Equation (15) holds.

$$V5=\beta*ID*Ron<\beta*ID*Ron_{150°\ C.}<\beta*VB/\alpha/\beta=VB/\alpha=V4 \tag{15}$$

Namely, if FET (T1) is selected so as to satisfy Equations (1), (3) and (4), FET (T1) will not be cut off as long as the wirings and load are normal, and the temperature of FET (T1) will not exceed 150° C.

Further, if the circuit is fallen in an excess current state, $V5=V4$. At this time, assuming that the drain current is IDs and a source-ground resistor is Rs, the following Equation (16) can be obtained.

$$V5=\beta*IDs*Ron=\beta*V2/Rs*Ron=V4=V2/\alpha \tag{16}$$

Therefore, the relationships $Rs=\alpha\beta Ron$ and $IDs=V2/Rs$ can be obtained. Namely, the resistance Rs is proportional to the resistance Ron. Further, at $Ron_{150°\ C.}$, Rs is maximum and IDs is minimum.

Now, since $\alpha=7/6$ from Equation (13) and $\beta=R5/R3=41$ (assuming that $R5=8.2$ [K$\Omega$] and $R3=200$ [$\Omega$]), the following Equation (17) can be obtained.

$$Rs=\alpha\beta Ron=47.8*Ron \tag{17}$$

Therefore, FET (T1) may be selected so that the value obtained by dividing the maximum resistance in the excess current state (=the minimum resistance in the normal state) by 47.8 is $Ron_{150°\ C.}$.

Assuming that the current value which provides the channel temperature of 150° C. when the drain current flows through FET (T1) is $ID_{150}$, $ID_{150} \geq ID_{150°\ C.\ \&\ TAmax}$. Therefore, it is known from Equation (3) that $ID_{150}$ cannot exist within the normal current range and hence is a value in the excess current range. $ID_{150}$ is not a constant value but will vary according to the ambient temperature. The value of the current $ID_{150}$ decreases as the ambient temperature rises, and becomes minimum, i.e. $ID_{150°\ C.\ \&\ TAmax}$ at the upper limit of the ambient temperature.

At this time, since $\beta*ID_{150}*Ron_{150°\ C.}>V4$, ID falls in the excess current state. When it exceeds $ID_{150}$ determined by the ambient temperature, FET (T1) is cut off. As the ambient temperature falls, a difference between the cut-off current value $ID_{150}$ and the normal current value increases. If $ID_{150}>ID$, even when ID is in the excess current state, the channel temperature is lower than 150° C.

Namely, since the current value $ID_{150}$ varies according to the ambient temperature, FET (T1) can be cut off before the channel temperature reaches 150° C.

Figure 3:
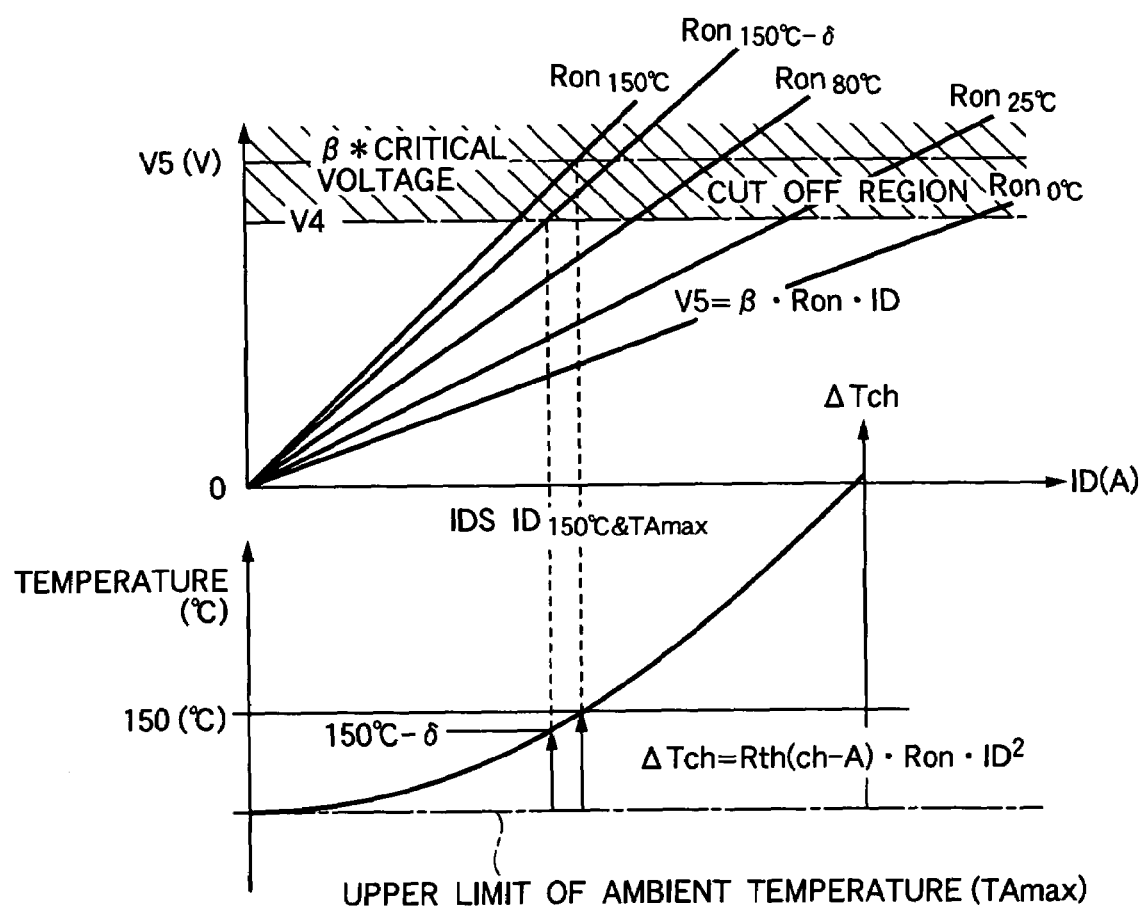
FIG. 3 is a characteristic graph showing the relationship among the on-resistance $Ron_{150° C.}$ when the channel temperature is at the upper limit of the permissible temperature, the minimum current value $ID_{150°\ C.\ \&\ TAmax}$ where the channel temperature reaches the upper limit (150° C.) of the permissible temperature by the self-heating when the operation ambient temperature is at the upper limit TAmax, a critical temperature, a reference voltage V4 and a V5 voltage at point p4.

FIG. 3 illustrates the relationship among the on-resistance $Ron_{150°\ C.}$ when the channel temperature is the upper limit (now, 150° C.) of a permissible temperature, the minimum current value $ID_{150°\ C.\ \&\ TAmax}$ which causes the channel temperature to reach the upper limit (150° C.) of the permissible temperature owing to the self-heating when the operation ambient temperature is the upper limit TAmax, a critical voltage, a reference voltage V4 and the voltage of V5 which is generated at the connecting point p4.

In FIG. 3, the abscissa axis represents the drain current ID which flows through FET (T1), and the ordinate axis represents V5 and channel temperature. As ID increases, V5 increases at the gradient defined by the on-resistance Ron. As the channel temperature rises, Ron increases so that the gradient of the straight line of the voltage of V5 relative to ID increases.

Ron is proportional to the 3/2-th power of the absolute temperature T, and 1.7 times at 150° C. as large as that at room temperature. The channel temperature rises from the operation ambient temperature TAmax by the self-heating due to Joule heat, and the minimum drain current where the channel temperature reaches 150° C. is $ID_{150°\ C.\ \&\ TAmax}$. In correspondence with this current value, the voltage at a point on the V5 straight line represented by the gradient of $Ron_{150°\ C.}$ is $\beta*$critical voltage.

If the reference voltage V4 is set at a value slightly lower than the $\beta*$ critical voltage, at the drain current $ID_{150°\ C.\ \&\ TAmax}$, FET (T1) will be cut off before the channel temperature reaches 150° C. Assuming that the minimum current value where the voltage V5 equal to the voltage V4 can be attained is IDs, at this IDs, the channel temperature cannot reach 150° C. by the self-heating so that the channel temperature where V5 equal to V4 is attained is 150° C.–δ which is lower than 150° C.

At the drain current lower than IDs, V4 is not attained. In this range of current, FET (T1) is not cut off. If the relationship between the load and FET (T1) is set so that the normal current (exclusive of the rush current) flowing through the load RL is not larger than IDs, as long as the load is normal, FET will not be cut off. If the excess current which exceeds the normal range flows, as long as it is not larger than IDs, FET (T1) will not be cut off.

However, at this time, the channel temperature does not reach 150° C. so that FET (T1) will not be damaged. Where the excess current not smaller than IDs flows, when Ron*ID exceeds V4, FET (T1) will be cut off. In this case also, the channel temperature does not exceed 150° C.–δ. As the difference (ID–IDs) increases, at a lower channel temperature, FET (T1) will be cut off.

The channel temperature of FET (T1) is maximum at the drain current of IDs. The channel temperature at this time is 150° C.–δ. Namely, when not only the drain current in the normal range but any excess current in the abnormal state flows, the channel temperature will not exceed 150° C.–δ. For this reason, FET (T1) will not be damaged but also surely protected. Where the reference value V4 is set at the value equal to δ*critical voltage, at $ID_{150° C. \& TAmax}$, the channel temperature reaches 150° C., but will not further rise. It is desired that the reference voltage V4 is set at a value not higher than β*critical voltage, considering changes in the on-resistance.

Figure 2:
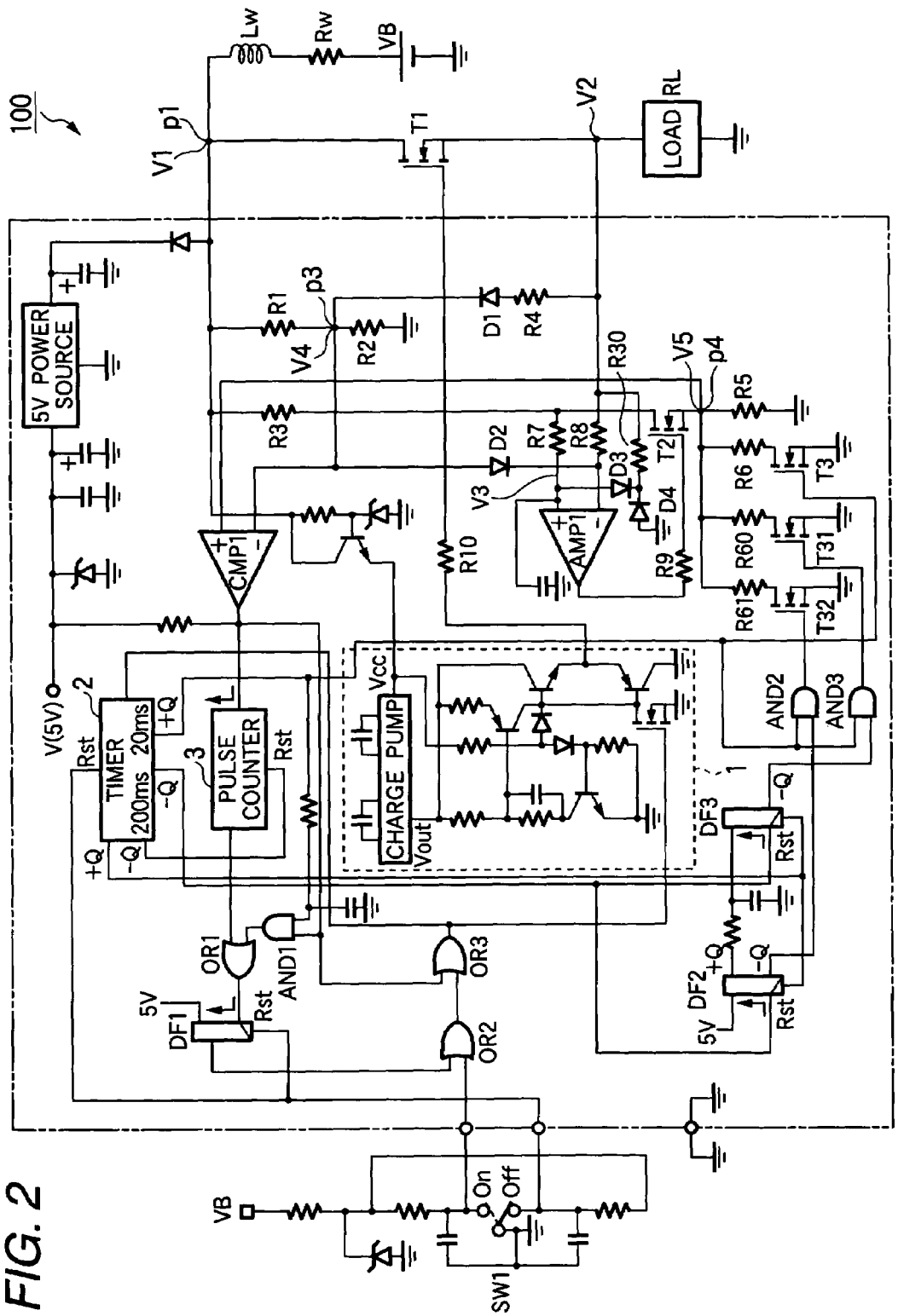
FIG. 2 is a circuit diagram showing the arrangement of the protection apparatus for a semiconductor device according to an embodiment of this invention.

FIG. 2 is a circuit diagram showing the arrangement of a protection apparatus for a semiconductor device including the circuit as shown in FIG. 1. A protection apparatus 100 for a semiconductor device includes a switch SW1 for switching the on/off of FET (T1), a driving circuit 1, a timer 2 and a pulse counter 3. The protection circuit 100 further includes OR circuits OR1–OR3, AND circuits AND1–AND3 and latches DF1–DF3.

The switch SW1 is connected to the one input terminal of the OR circuit OR2 and the other input terminal of the OR circuit OR2 is connected to the output terminal of the latch DF1.

The output terminal of the OR circuit OR2 is connected to the one input terminal of the OR circuit OR3, and the other input terminal of the OR circuit OR3 is connected to the output terminal of the comparator CMP1. The output terminal of the OR circuit OR3 is connected to the driving circuit 1 and also connected to the timer 2. The output of the driving circuit 1 is connected to the gate of FET(T1) via the resistor R10. The output terminal of the comparator CMP1 is connected to the pulse counter 3.

Three resistors R61, R60 and R6 are arranged in parallel to the resistor R5. The resistor R61 is connected to ground via a transistor T32. Likewise, the resistor R60 is connected to ground via a transistor T31 and the resistor R6 is connected to ground via a transistor T3.

The gate of the transistor T3 is connected to the output terminal of the timer 2. The gate of the transistor T31 is connected to the output terminal of the AND circuit AND3. The gate of the transistor T32 is connected to the output terminal of the AND circuit AND2.

On the input side of the amplifier AMP1, diodes D2, D3 and D4 and a resistor R30 are arranged.

An explanation will be given of the operation of the protection apparatus 100 for a semiconductor device as shown in FIG. 2. When the switch SW1 is off, the latch DF1 is reset so that the output terminal of the latch DF1 connected to the OR circuit OR2 becomes "L" level. When the switch SW1 is turned on by an operator, the potential of the wiring connected to the input terminal of the OR circuit OR2 becomes L level so that the output from the OR circuit OR2 is changed from H level to L level. If FET (T1) is off, the output of the comparator CMP1 is L level so that the output from the OR circuit OR3 becomes L level. The signal at L level is supplied to the driving circuit 1.

Thus, the driving circuit 1 supplies a driving signal to the gate of FET (T1). Then, FET (T1) turns on so that a current flows to the load RL from the power source VB to drive the load RL. Where the load RL is a lamp, the lamp is illuminated.

The output signal from the OR circuit OR3 supplied to the timer 2 so that the timer 2 is started. The timer 2 includes an output (+Q) which is at H level for 20 ms and another output which is at H level for 200 ms. The 20 ms output (+Q) turns on the transistors T3, T31 and T32 so that the resistors R6, R60 and R61 are connected in parallel to the resistor R5.

Thus, the multiplication factor β is β=(R5|R6|R60|R61)/R3 and becomes smaller than a standard value R5/R3. Therefore, the voltage of V5 relative to the drain current ID flowing through FET (T1) decreases by the degree of the decrease in β so that the voltage of V5 is difficult to exceed the voltage of V4. This is a measure for overcoming the rush current which transiently flows when the switch SW1 turns on.

When 20 ms elapses, the 20 ms timer output (+Q) becomes L level so that the transistors T3, T31 and T32 turn off. Thus, the value of β returns to the standard value R5/R3. Simultaneously, the latch DF2 is triggered so that the output (−Q) of DF2 changes from H level to L level.

At this time, if V5<V4, the output from the CMP1 maintains L level so that the transistors T3, T31 and T32 remain off. If V5>V4, the output from the CMP1 becomes H level. Thus, the timer starts again so that the 20 ms timer output (+Q) becomes H level. At this time, the transistors T3 and T31 turn on, but the transistor T32 remains off because the output (−Q) from the latch DF2 is L level so that the output from the AND2 is L level.

The value of β becomes β=(R5|R6|R60)/R3, which is larger than the initial value but smaller than the standard value. When the second time of output period of the 20 ms timer ends, the latch DF3 is triggered. Therefore, if the 20 ms timer produces the third times of output et seq., only T3 turns on whereas T31 and T32 remain off. The number of times of outputs from the 20 ms timer is counted up by the counter 3. If it exceeds 8 (eight) times, it is decided that the circuit is in the abnormal state. Under this decision, the latch DF1 is triggered so that even if SW1 is on, FET (T1) is cut off.

Thus, even if the rush current is produced when SW1 is turned on, as long as it is the normal rush current which decreases exponentially to reach a stable value, the trouble that the circuit is interrupted because of flowing of the rush current can be avoided.

After a while from when SW1 is turned on, where the current value is stable, if a slightly excessive current (e.g. layer short-circuiting) flows, the voltage VDS between the two main electrodes (drain-source voltage) of FET (T1) is increased.

Since the amplifier AMP1 controls the transistor T2 so that the voltage across the resistor R3 is equal to the drain-source voltage VDS of FET (T1), the current flowing through the resistor R3 varies to increase.

Therefore, the voltage V5 (=β*VDS) at the connecting point p4 increases and hence the voltage supplied to the plus input terminal of the comparator CMP1 increases (at this time, the transistors T32, T31 and T3 are all off).

When the voltage V5 exceeds the reference voltage V4, the output signal from the comparator CMP1 is reversed from L level to H level, thereby the pulse counter 3 is incremented.

Simultaneously, the timer 2 is triggered and the 20 ms timer output (+Q) becomes H level so that like the measure for the rush current at the start, the three transistors T32, T31 and T3 are on only for 20 ms, respectively. This decreases the multiplication factor of β so that the voltage V5 at the point p4 decreases and becomes lower than the voltage V4 (the case where the voltage V5 decreases but does not become lower than the voltage V4 will be described later).

When 20 ms elapses, the transistors T32, T31 and T3 become off so that the latch DF2 is triggered and the multiplication factor β returns to the standard value. Thus, V5>V4 is held so that the timer 2 is triggered and the 20 ms timer starts the second operation thereby the output (+Q) becomes H level.

Therefore, the transistors T31 and T3 turn on whereas the transistor T32 remains off because the output (−Q) of the latch DF2 is L level. The multiplication factor β becomes (R5|R6|R60)/R3. If V5 remains larger than V4 with this value β, the output of the comparator CMP1 becomes H level.

Since the 20 ms timer output (+Q) and the CMP1 output are both H levels, the AND circuit AND1 output changes from L level into H level. Therefore, the latch DF1 is triggered through the OR circuit OR1 so that the DF1 output becomes H level and hence FET is cut off. On the other hand, if V5<V4 is held, the CMP1 output remains L level so that FET (T1) remains on for 20 ms. When the second output of the 20 ms time is ended, the latch DF3 is triggered so that the output (−Q) of the latch DF3 changes from H level to L level. The transistors T31, T3 turn off so that β returns to the reference value. Then, V5>V4 is held so that the 20 ms timer makes the third time start.

At the third time, only the transistor T3 turns on and the transistors T32 and T31 remain off so that β=(R5|R6)/R3. At this time, if V5>V4, the AND1 output becomes H level so that the latch DF1 is triggered and hence FET (T1) is cut off. If V5<V4, FET (T1) remains on for 20 ms. When the 20 ms timer is ended, V5>V4 so that the 20 ms timer makes the fourth time start.

In this case, only the transistor T3 turns on. But V5<V4 so that FET (T1) remains on for 20 ms. Thereafter, the 20 ms timer operation is repeated until the fifth time, sixth time and seventh time. The counter 3 counts up the number of times of operation of the timer.

At the timing when the eighth time timer operation starts, the counter 3 overflows so that the latch DF1 is triggered and FET (T1) is cut off. The explanation hitherto made applies to the case where the abnormal state (excess current) occurs successively. However, as the case may be, the abnormal state may occur intermittently. Further, owing to malfunction, the 20 ms time may start.

In order to deal with these cases, if the 20 ms timer does not start again for 200 ms or longer, the counter 3 and the latches DF2 and DF3 are reset. The 200 ms timer included in the timer 2 performs this operation. By the operation explained hitherto, the time taken until the cut-off of FET (T1) is shortened as the excess current increases. This technique permits FET (T1) and the circuit connected thereto to be surely protected.

An explanation will be given of the case where a severe excess current (dead short-circuiting) has occurred owing to the short-circuiting of the load RL or grounding of the wiring connecting FET (T1) and the load RL. In this case, the wiring inductance and wiring resistance do not become negligible so that the relationship of VB≈V1≈V2, which was used to acquire Equation (6), does not hold, and V4=VB/α does not also hold. Therefore, VB>V1>V2. Assuming that γ=VB/V2, the following Equation (18) holds.

$$V4 = V2/\alpha = VB/\alpha\gamma \quad (18)$$

From Equation (18), the voltage V4 is 1/γ times of that in the normal state. This is equivalent to that the cut-off current of FET (T1) has become 1/γ, thus hastening the cut-off of FET (T1).

Specifically, in the dead short-circuiting, the voltage V5 at the point p4 increases but the voltage V4 decreases (becomes 1/γ) so that the inversion of the comparator CMP1 is facilitated, thereby suppressing the peak value of the excess current.

In the dead short-circuiting, even if the 20 ms timer output (+Q) becomes H level so that the transistors T32, T31 and T3 turn on to decrease the voltage V5, the voltage V5 is still higher than the voltage V4 so that the output signal from the comparator CMP1 remains the H level. Thus, the output signal from the AND circuit AND1 becomes the H level, and the driving circuit 1 is interrupted by the latch DF1.

Therefore, when the dead short-circuiting has occurred, the counting (e.g. eight times) by the pulse counter 3 is not done, and the driving circuit 1 is instantaneously interrupted so that FET (T1) is cut off.

In this way, in the protection apparatus 100 for a semiconductor device according to this invention, where the excess current flows through the load RL, before the channel temperature of FET (T1) reaches a prescribed temperature (in this embodiment, 150° C.), this FET is cut off so that the application of the voltage to the load RL is stopped, thereby preventing FET (T1) from being damaged.

Specifically, using the characteristic of FET that the on-resistance Ron increases monotonously with a rise in the channel temperature, FET is caused to operate at the value not larger than the on-resistance Ron corresponding to the upper limit of the permissible channel temperature. This feature is realized by measuring the drain-source drop of FET (T1) which increases with an increase of Ron and by interrupting the circuit when the voltage drop reaches a prescribed level. By such a control, the channel temperature of FET (T1) does not exceed the upper limit of the permissible temperature in any case so that the semiconductor device can be surely protected.

Further, the elapses to interrupt the circuit depends on the magnitude of the excess current. If there occurs such excess current as twice to four times as large as the normal current (current in the normal operation), which is scarcely accompanied by the rise in the channel temperature, the circuit is designed to be interrupted after e.g. 160 ms elapses; if it is four times to eight times, interrupted after 40 ms elapses; and if it is eight times to sixteen times, interrupted after 20 ms elapses (this magnification is decided by the magnitudes of the resistors R61, R60, R6 and R5). If it is sixteen times or more (in the case of the dead short-circuiting), the circuit is interrupted after about 250 μs elapses. Therefore, the circuit can be interrupted according to the magnitude of the excess current.

Further, when the dead short-circuiting is occurred, the compressing effect of the reference voltage is produced (the voltage V4 becomes 1/γ), the device is cut off earlier so that the device and wiring can be protected.

Next, an explanation will be given of changes of the on-resistance of FET (T1). The FET(T1)s having the same specification and standard provide different on-resistances among individual devices.

It should be noted that as the on-resistance of FET (T1) increases, the drain current ID by which the drain-source voltage of FET (T1) reaches the reference value decreases inverse-proportionately so that the cut-off of FET (T1) is facilitated.

When the on-resistance Ron of FET (T1) is minimum, the cut-off current IDs and the channel heat generation ΔTch are maximum. If there are changes in the on-resistance $Ron_{150°\ C.}$ at the channel temperature of 150° C., the characteristic of the above Equation (1) may be set using the minimum value in the changes of the on-resistance Ron.

The on-resistance $Ron_{150°\ C.}$ that is brought by the channel temperature of 150° C. may increase owing to an aged deterioration or an incidental deterioration, but will never decrease. In other words, we cannot estimate the upper limit of the on-resistance, but we can clearly estimate the lower limit of the on-resistance. Therefore, the maximum value of the channel heat generation ΔTch that would cut off the circuit has a clear upper limit, thereby realizing the stable protection performance.

An explanation will be given of the contrast of this invention with the related protection apparatus in a current detection system. The current detection system is a system in which as in the case of using a shunt resistance, a load current when it exceeds a prescribed current, is detected to interrupt the circuit.

In the current detection system, the channel heat generation ΔTch increases in proportion to the on-resistance Ron. However, this change of the channel heat generation does not appear as a change in the current so that the increase in the on-resistance Ron is not detected. When the on-resistance Ron increases, the channel heat generation further increases, which results in thermal runaway. Therefore, in the related current detection system, an excessive heating interrupting function must be incorporated separately.

In other words, in the excessive current protecting apparatus according to this embodiment, when the on-resistance Ron increases, the interrupting current value decreases so that the channel self-heating due to the increase in the on-resistance can be suppressed, which does not result in the thermal runaway. Therefore, unlike the current detection system, the excessive heating interrupting function may not be incorporated separately.

Further, since the device is cut off before the channel temperature reaches 150° C., the cause which gives damages to the device can be cancelled. Therefore, the occurrence of the on-mode failure of the device can be suppressed, thereby improving the reliability.

At a low ambient temperature, the on-resistance Ron is small so that there is an allowance of passing a large current (even when a slight excess current occurs, the circuit can be operated without shutting off). In the related excess current detection system, a decrease in the on-resistance cannot be detected so that when the increase in the current value is detected, the circuit is interrupted regardless of the ambient temperature. Therefore, the allowance cannot be employed. In this point also, this invention is more advantageous than the related excess current detecting system.

INDUSTRIAL APPLICABILITY

Hitherto, with reference to the embodiment shown in the drawings, the explanation was made of the protection apparatus for a semiconductor device and method of setting circuit constants. However, this invention should not be limited to these apparatus and method, but respective components can be replaced by any optional components having the same functions.

For example, in this embodiment, FET (T1) was arranged between the plus (+) terminal of the load RL and the plus (+) terminal of the power source, but in this invention, without being limited to such an arrangement, FET (T1) can be provided on the minus (−) terminal of the load RL.

The invention claimed is:

1. A method of protecting a semiconductor device, comprising the steps of:
   providing a DC power source, a load, and a semiconductor device arranged between the DC power source and the load;
   providing a circuit element connected to the semiconductor device;
   switching the semiconductor device so that the load is changed between a driving state and a stopping state;
   cutting off a conduction of the semiconductor device between the DC power source and the load when a voltage drop across the semiconductor device exceeds a predetermined reference voltage; and
   setting a constant of the circuit element so that the reference voltage is not greater than a critical voltage, wherein the critical voltage is a product of an on-resistance of the semiconductor device when its channel temperature is at an upper limit of a permissible temperature, and a minimum current value which causes the channel temperature to reach the upper limit of the permissible temperature by the self-heating due to Joule heat.

2. The method as set forth in claim 1, wherein when there are changes in the on-resistance for the specification of the semiconductor device, the minimum value among the changes of the on-resistance is employed.

3. A protection apparatus for a semiconductor device comprising:
   a DC power source;
   a load;
   a semiconductor device, arranged between the DC power source and the load, and changes the load between a driving state and a stopping state;
   a circuit element, connected to the semiconductor device;
   a comparator, comparing a voltage drop across the semiconductor device with a predetermined reference voltage; and
   a cut off section, cutting a conduction of the semiconductor device between the DC power source and the load when the voltage drop is greater than the predetermined reference voltage,
   wherein a constant of the circuit element is set so that the reference voltage is not greater than a critical voltage; and
   wherein the critical voltage is a product of the on-resistance of the semiconductor device when its channel temperature is at an upper limit of a permissible temperature, and a minimum current value which causes the channel temperature to reach the upper limit of the permissible temperature by the self-heating due to Joule heat.

4. The protection apparatus as set forth in claim 3, wherein when there are changes in the on-resistance for the specification of the semiconductor device, the minimum value among the changes of the on-resistance is employed.

* * * * *